(12) United States Patent
Wiegert et al.

(10) Patent No.: US 7,603,251 B1
(45) Date of Patent: Oct. 13, 2009

(54) MAGNETIC ANOMALY SENSING SYSTEM FOR DETECTION, LOCALIZATION AND CLASSIFICATION OF A MAGNETIC OBJECT IN A CLUTTERED FIELD OF MAGNETIC ANOMALIES

(75) Inventors: Roy Wiegert, Panama City, FL (US); John Oeschger, Lynn Haven, FL (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 12/214,803

(22) Filed: Jun. 23, 2008

(51) Int. Cl.
*G01V 3/00* (2006.01)
*G06F 19/00* (2006.01)

(52) U.S. Cl. .................................... 702/152
(58) Field of Classification Search ................ 702/152, 702/38, 94, 95, 141, 150–153, 155, 158; 324/200, 207.11, 207.13, 345, 326, 244, 324/260; 701/1, 23–24
See application file for complete search history.

(56) References Cited

U.S. PATENT DOCUMENTS

| | | | | |
|---|---|---|---|---|
| 4,058,275 A | * | 11/1977 | Banks et al. ................ | 244/3.15 |
| 5,777,477 A | * | 7/1998 | Wynn ......................... | 324/345 |
| 6,476,610 B1 | * | 11/2002 | Wiegert et al. .............. | 324/345 |
| 6,781,380 B1 | * | 8/2004 | Wiegert ...................... | 324/329 |
| 6,841,994 B1 | * | 1/2005 | Wiegert ...................... | 324/244 |
| 6,865,455 B1 | * | 3/2005 | Wiegert ....................... | 701/23 |
| 6,888,353 B1 | * | 5/2005 | Wiegert ...................... | 324/345 |
| 7,038,458 B1 | * | 5/2006 | Wiegert ...................... | 324/345 |
| 7,062,391 B2 | * | 6/2006 | Wilson ........................ | 702/64 |
| 7,342,399 B1 | * | 3/2008 | Wiegert ...................... | 324/326 |

* cited by examiner

*Primary Examiner*—Michael P. Nghiem
*Assistant Examiner*—Cindy H Khuu
(74) *Attorney, Agent, or Firm*—James T. Shepherd

(57) ABSTRACT

A magnetic anomaly sensing system and method uses at least eight triaxial magnetometer (TM) sensors arranged to define a cubic space. Each TM sensor measures a local magnetic field associated with a target region and generates magnetic field data indicative thereof. The magnetic field data is processed in accordance with a magnetic scalar triangulation and ranging (STAR) processing scheme to determine a plurality of gradient contractions $C_{T,I}$ at a corresponding plurality of measurement points I to include at least at the center of each face of the cubic space. Gradient contraction pairs are defined for each sensors' X, Y, Z magnetic sensing axes. A directional derivative $\nabla C_T$ is determined using the gradient contraction pairs and the baseline distances therebetween. A unit vector, calculated using the directional derivative $\nabla C_T$, is used in determining a projection distance from each of the measurement points toward the target region.

18 Claims, 6 Drawing Sheets

MAGNETIC ANOMALY SENSING SYSTEM FOR DETECTION, LOCALIZATION AND CLASSIFICATION OF A MAGNETIC OBJECT IN A CLUTTERED FIELD OF MAGNETIC ANOMALIES

ORIGIN OF THE INVENTION

The invention described herein was made in the performance of official duties by employees of the Department of the Navy and may be manufactured, used, licensed by or for the Government for any governmental purpose without payment of any royalties thereon.

FIELD OF THE INVENTION

The invention relates generally to magnetic sensing systems and more particularly to a magnetic anomaly sensing system that can perform detection, localization and classification of a magnetic object when the object is in a cluttered field of magnetic anomalies.

BACKGROUND OF THE INVENTION

There are many potential military and commercial applications for an improved magnetic sensing system that can more effectively and rapidly detect the presence of a magnetic object, locate its position in space, and classify the object in terms of the magnitude and direction of the source of its "magnetic anomaly field". In particular, there is a need for improved passive magnetic sensing systems that can perform Detection, Localization and Classification (DLC) of magnetic objects (or "targets"). Magnetic anomaly fields emanate from the "magnetic moments" (or signatures) that are produced by the ferrous materials (e.g., iron, steel, etc.) that are contained in the physical structure of a target. The magnetic field of a target produces localized spatial distortions (i.e., "anomalies") in the otherwise relatively constant Earth's background magnetic field. At distances from a target that are more than two or three times the target's longest dimension, its magnetic anomaly field can be mathematically described by the well known magnetostatic dipole equation. The dipole equation relates the spatial variations of the anomaly field of a magnetically polarized object to the object's vector magnetic dipole signature. Conversely, measurements of an object's magnetic anomaly field can be used in conjunction with the dipole equation (or its spatial gradients) to determine the object's location and its magnetic dipole signature. The magnitude and direction of a target's magnetic signature depends on the orientation of the target's ferrous materials with respect to the Earth's field and also on the size, geometry and magnetic permeability of the ferrous materials. Thus, in principle, magnetic sensor systems can perform DLC of magnetic objects by detecting the presence of a magnetic anomaly field, determining the location of its source, and classifying the object in terms of its magnetic signature.

In general, targets of interest can include stationary objects such as buried explosive mines and/or other unexploded ordnance. Mobile targets of interest include naval vessels and land vehicles such as cars, trucks or military tanks. For stationary targets, the magnetic sensing based system should be capable of performing effective DLC while the sensing platform is in motion. For mobile targets, the sensing system should be able to function well while stationary. However, for many important sensing applications, the system should be able to perform effective DLC while both the target and the sensing system are in motion.

An optimally effective magnetic sensing system should be capable of performing nearly instantaneous (i.e., "real-time") DLC of both mobile and stationary targets. In particular, the sensing system should be capable of measuring a complete set of DLC parameters (e.g., target range, bearing and magnetic signature) at any sensor position within detection range of the target. Furthermore, the sensing system should be able to discriminate or differentiate between the magnetic signature of a target of interest and magnetic anomaly fields due to non-target-type magnetic objects (i.e., "magnetic clutter" and/or magnetic noise from geologic sources) that may lie within the detection range or field-of-view of the sensor system. Thus, an effective magnetic sensing system should be capable of "point-by-point" DLC of magnetic targets with minimal delay between the sensor's detection of a magnetic target and its output/display of target localization and classification data.

Accurate detection, ranging and classification of magnetic objects usually requires a number of vector magnetic sensors that are configured as magnetic tensor "gradiometers". A gradiometer measures "magnetic gradients", i.e., rate of change of magnetic fields with distance. It is known in the art that conventional gradiometers can perform point-by-point DLC of a magnetic dipole target by using a magnetic sensing system that measures five independent gradient tensor components and a set of vector field components of the target's magnetic anomaly field. However, limitations of conventional approaches have limited the development of magnetic gradiometry to experimental devices that do not appear to be practical for general DLC applications. The limitations of prior art conventional tensor gradiometers include the following:

Localization methods that are rather complex, computationally intensive and difficult to implement in a cost effective and easily deployable system.
  Requirements for sensor platform motion to be impractically constrained to be along nearly constant velocity straight-line paths with very little change in sensor platform orientation.
  A DLC response that may be too slow for cases where there is fast relative motion between sensor system and target.
  Accuracy that may be reduced if the target's magnetic signature changes with the target's motion.
  Data sets that do not allow development of an optimal target discrimination capability for cases where the magnetic signature of a target of interest is convolved with non-target-related magnetic anomalies such as magnetic clutter and/or geologic noise.

U.S. Pat. No. 6,476,610 (i.e., "the '610 patent" as it will be referred to hereinafter) addressed certain aspects of the limitations of conventional gradiometry. Briefly, the '610 patent disclosed a novel magnetic gradiometer and signal processing approach based on a "scalar triangulation and ranging" (STAR)" concept for target localization from maneuverable sensing platforms. The STAR method uses unique, rotationally invariant scalar "contractions" of magnetic gradient tensor components to "triangulate" relative distances to a target. Within the target-detection distance of a STAR-type gradiometer, the scalar triangulation process does not directly depend on the direction or magnitude of a target's magnetic dipole signature.

More recently, U.S. Pat. No. 6,841,994 (i.e., "the '994 patent" as it will be referred to hereinafter) disclosed significant improvements to the STAR design and method that allow better measurements of the range, relative bearing and magnetic signature of stationary targets from mobile sensing platforms. Still more recently, U.S. Pat. No. 7,342,399 (i.e., "the '399 patent" as it will be referred to hereinafter) discloses improved STAR-type magnetic sensing-based means and methods for real-time tracking of a moving magnetic target and for reducing certain "asphericity errors" that are inherent to the STAR DLC method. The above-noted patents successfully address several of the above-mentioned limitations. However, these prior art magnetic sensing systems still have the following limitations:

DLC methods that preferentially involve physically pointing a particular sensor system axis at the target, i.e., they require means and methods for mechanically orienting a sensor. However, the need for an orientation/positioning modality may be undesirable or impractical for some applications.

DLC methods that apply primarily to dipole-type magnetic anomaly fields where the magnetic targets are isolated from other sources of magnetic anomaly fields. However, many magnetic anomaly sensing applications require localization and discrimination of magnetic objects within magnetically complex environments where fields from multiple targets, magnetic clutter and/or geologic noise may be within the field-of-view of the sensor system.

As disclosed in the above-noted patents, the gradient contraction ($C_T$) of the full, nine-component magnetic gradient tensor of a magnetic dipole target is a rotationally invariant and robust scalar that is independent of gradiometer orientation. The "scalar contractions" that provide the basis for the STAR method and their relation to the multiple target problem will be explained briefly with the aid of FIG. 1 that summarizes the essential geometrical features of the gradient contraction based STAR method for localization and discrimination of magnetic objects.

In FIG. 1, the geometrical features of the magnetic lines of force (or B-field as it is known) surrounding a dipole target T are qualitatively represented by solid lines and contours of constant $C_T$ field surrounding target T are indicated by dashed lines. Mathematically, at a given sensor-to-target distance "r", $C_T$ is primarily a function of the magnetic dipole moment M of target T, distance r, and a dimensionless asphericity parameter "k". The k-parameter characterizes the variance of $C_T$ from true spherical symmetry. For media with constant magnetic permeability μ, $C_T$ has the form of a slightly aspherical central potential type function. Specifically, $C_T=k(\mu/4\pi)M/r^4$ where calculations show that k is an "asphericity parameter" that is a number that slowly varies from approximately 7.3 for points aligned with the dipole axis to 4.2 for points transverse to the axis. Conversely, for contours of constant gradient contraction, the ratio of the diameter on the dipole axis to a diameter transverse to the axis is approximately 1.14 to 1.

The presence of multiple magnetic objects can result in significant overlapping of magnetic anomaly fields. The overlapping fields can distort the topology of contours of constant $C_T$ in such a manner that, in some regions (particularly between field sources), the $C_T$ contours may not enclose a single field source. Thus, in some regions between multiple sources of magnetic anomaly fields, the prior art STAR methods can be inaccurate.

SUMMARY OF THE INVENTION

Accordingly, it is an object of the present invention to provide an improved magnetic anomaly sensing system for "detection, localization and classification/discrimination" (DLC) of magnetic objects.

Yet another object of the invention is to provide a magnetic anomaly sensing system that can perform complete DLC of a magnetic object at any system position, orientation, and/or state of motion.

Still another object of the invention is to provide a magnetic anomaly sensing system that can be used to discriminate a target in the presence of multiple sources of magnetic anomalies.

Other objects and advantages of the present invention will become more obvious hereinafter in the specification and drawings.

In accordance with the present invention, a magnetic anomaly sensing system and method are provided. At least eight triaxial magnetometer (TM) sensors are used with one TM sensor positioned at each vertex of a cubic space. Each TM sensor has X, Y, Z magnetic sensing axes with the sensors being positioned such that respective ones of the X, Y, Z magnetic sensing axes are mutually parallel to one another. Each TM sensor measures a local magnetic field associated with a target region and generates magnetic field data indicative thereof. Processor(s) are coupled to the TM sensors to (a) process the magnetic field data in accordance with a magnetic scalar triangulation and ranging (STAR) processing scheme to determine a plurality of gradient contractions $C_{T,I}$ at a corresponding plurality of measurement points I to include at least at the center of each face of the cubic space (Gradient contraction pairs ($C_{T,+X}$ and $C_{T,-X}$), ($C_{T,+Y}$ and $C_{T,-Y}$) and ($C_{T,+Z}$ and $C_{T,-Z}$) are defined for each of the X, Y, Z magnetic sensing axes. Each gradient contraction pair is symmetrically disposed about the center of the cubic space. Gradient contractions from each of the gradient contraction pairs are separated by a corresponding baseline distance $\Delta S_X$, $\Delta S_Y$ and $\Delta S_Z$.), (b) determine a directional derivative $\nabla C_T$ using the gradient contraction pairs and baseline distances, (c) calculate a unit vector using the directional derivative $\nabla C_T$, (d) determine a projection distance from each of the measurement points to the target region where each projection distance is a function of the unit vector and one of the baseline distances $\Delta S_X$, $\Delta S_Y$ and $\Delta S_Z$, and (e) process each projection distance in accordance with the STAR processing scheme to determine values indicative of (i) a position vector from the center of the cubic space to the target region, and (ii) a magnetic moment vector. Output generator(s) are coupled to the processor(s) generate at least one of a human-discernable output and a computer-discernable output of the values.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

In general, the present invention is a magnetic anomaly sensing-based system and method for the "detection, localization and classification" (DLC) of stationary and/or moving objects (i.e., "targets") that have magnetic signatures. The term "target" as used herein refers to any natural or man-made object residing on/under the ground or in the water, with the object having an inherent magnetic signature owing to the ferrous material(s) that are included in the object's physical structure.

The present invention's new and improved methods of target localization and discrimination exploit the fact that the gradient contraction $C_T$ "field" of a magnetic object is mathematically analogous to a central potential field that emanates from the object. The system includes magnetic sensors and a processor that continually determines magnetic gradient tensors associated with the target and converts the magnetic gradient tensors to gradient contraction scalars. The gradient contraction scalars have a unique, central-potential-field-type relation to the target that the invention's new and improved embodiments and signal processing methods exploit to determine relative position variables (e.g., range, bearing and elevation) and magnetic signature of the target.

The improved target-DLC capabilities of the present invention result from the symmetries of its sensor system embodiments and its innovative methods of processing the sensor systems' vector, tensor and scalar data. Each sensor system embodiment includes a three-dimensional (3-D) array of "triaxial magnetometers" (TM) mounted on a non-magnetic support structure. The TM sensors are arrayed with their respective XYZ field-sensing elements in parallel. There are many possible geometric configurations of TM sensors that can provide data for the invention's improved methods. However, the cubically symmetric designs that are disclosed herein provide enhanced parameter bases with significant advantages for the invention's improved DLC methods.

Figure 1:
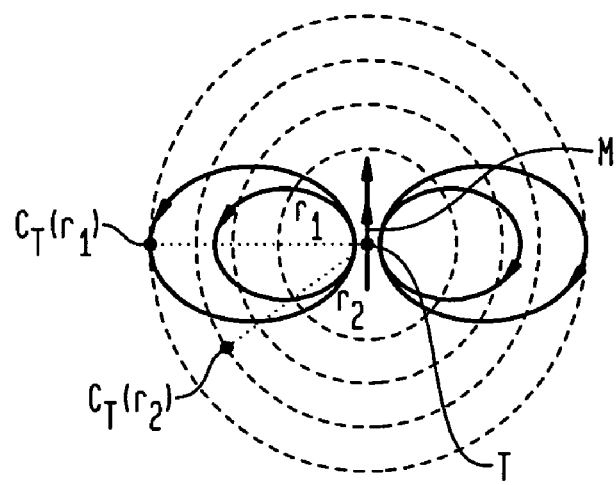
FIG. 1 is a graphical description of the basic geometrical relationships between parameters used in "scalar triangulation and ranging" (STAR) magnetic sensing.
Figure 2:
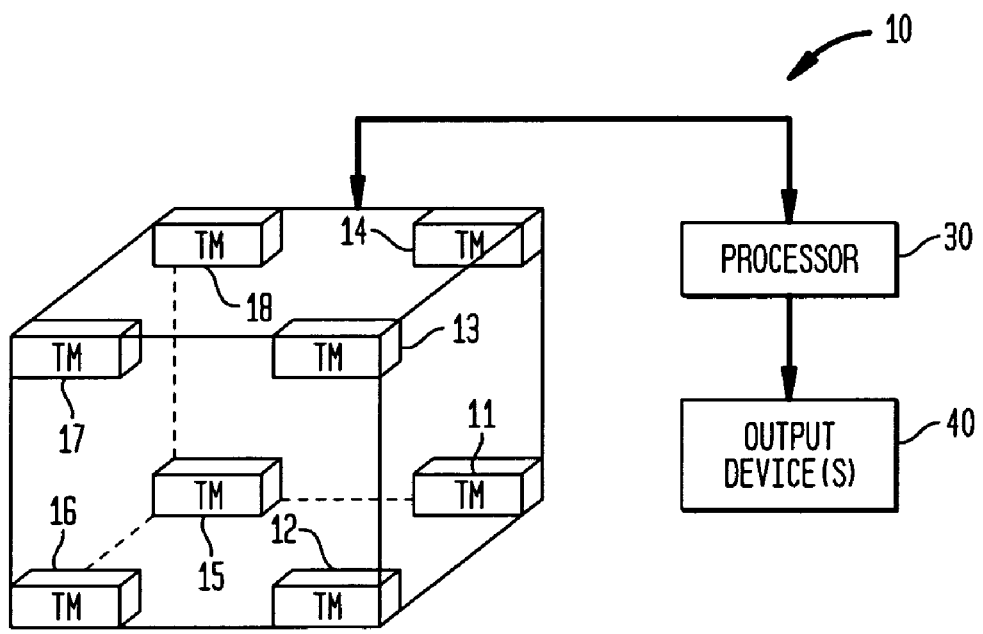
FIG. 2 is a top-level schematic of an embodiment of the present invention that uses a simple cubic array of "triaxial magnetometer" (TM) sensors.

FIG. 2 illustrates the basic design of a magnetic anomaly sensing system 10 in accordance with the present invention. System 10 can passively measure magnetic gradient tensors associated with the magnetic signature of a target, and then convert the tensor data to gradient contraction scalars. The basic features of such magnetic anomaly sensing systems are disclosed in detail in U.S. Pat. Nos. 6,476,610 and 6,841,994, the entire contents of which are hereby incorporated by reference.

Briefly, magnetic anomaly sensing system 10 uses a plurality of TM sensors 11-18 (illustrated simply as "TM" in the figures) with each of the TM sensors having X, Y, Z magnetic sensing axes. In this basic design of the present invention, TM sensors 11-18 are arranged/positioned at the vertices of a three-dimensional cubic space with respective ones of the X, Y, Z magnetic sensing axes being mutually parallel to one another to thereby define a three-dimensional sensor array. As would be understood by one of ordinary skill in the art, TM sensors 11-18 are coupled together in their above-described relationship in a fixed and rigid fashion by a non-magnetic frame or other support means that is omitted for clarity of illustration. The three-dimensional cubic array of TM sensors defines a geometry that forms a plurality of single-axis gradiometers with each such gradiometer defined between vertices of the cubic array. Each of TM sensors 11-18 senses a local magnetic field and outputs magnetic field data indicative thereof in an analog or digital fashion. The magnetic field data is output for each of the three X, Y, Z sensing axes of a TM sensor.

In general, the processing portion of system 10 includes a processor 30 and one or more output device(s) 40. For clarity of illustration, signal lines coupling TM sensors 11-18 to processor 30 are not shown. Briefly, the analog or digital outputs of TM sensors 11-18 are provided to processor 30 which implements a magnetic "scalar triangulation and ranging" (STAR) processing scheme as well as new processing methods that allow system 10 to perform DLC even when a target is in a crowded or cluttered field of magnetic anomalies. In general, processor 30 includes signal processing hardware and software that can (i) use the TM sensors' data to simultaneously develop all B-field components, (ii) develop a 3-D array of at least six motion-compensated gradient tensors. $G_i$ and, correspondingly, at least six gradient tensor magnitudes or gradient contractions $C_{T,I}$, and (iii) use the $C_{T,I}$ parameters in the present invention's improved STAR scheme for localization and classification/discrimination of magnetic objects in the "field-of-view" of system 10. The improved STAR scheme performs DLC of magnetic objects by implementing a "directional derivative" method for localization and classification of magnetic targets and, optionally, a "least squares fit" method for localization and classification of magnetic targets. The ultimate result generated by processor 30 is values indicative of a target localization vector r and a magnetic signature vector M. These values are presented in human-discernable format(s). (e.g., audio and/or visual) and/or computer-discernable format(s) by output device(s) 40.

Note that certain design, construction and operational requirements that are common to magnetic anomaly sensing, (e.g., mitigation of gradiometer imbalance errors and platform signature and the use of non-magnetic materials in proximity to magnetic sensors) should be well-known to those of ordinary skill in the art of magnetic sensing. Consequently, this disclosure does not address these issues in detail, although these issues are addressed in the above-cited '610 and '994 patents.

The simple cubic array of eight TM sensors 11-18 can provide the data used by the present invention's improved localization and discrimination methods. Each TM sensor measures the XYZ components of B-field at its location. The TM sensors in each I-th face of the cube (where I=±X, ±Y, ±Z) constitute a planar gradiometer whose data are combined in system processor 30 and used to calculate a $C_{T,I}$ parameter at the I-th face's center.

Figure 3:
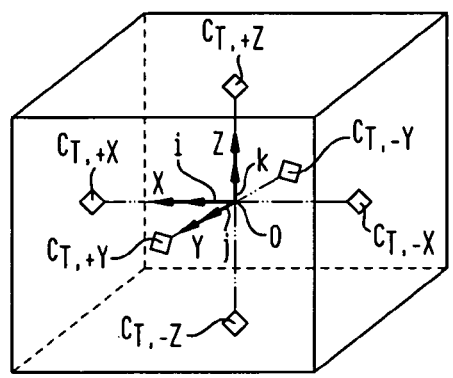
FIG. 3 illustrates the geometrical relations of the invention's gradient contraction parameters ($C_{T,I}$) and the TM sensor array's Cartesian coordinate system.

Referring additionally to FIG. 3, the geometrical configuration of the $C_T$ parameter array and the STAR sensor's Cartesian (XYZ) coordinate system are illustrated. For clarity, the TM sensors are not shown. The center of coordinates (O) is at the geometric center of the cubic space. Distances between respective $C_T$ parameters (e.g., $C_{T,+Z}$, $C_{T,-Z}$) along the XYZ axes constitute "triangulation baselines" that the present invention uses to perform enhanced DLC of magnetic targets.

The geometrical configuration of parameters from the above-described symmetrical, three-dimensional STAR sensor array is capable of being used to generate at least six $C_{T,I}$ parameters (where I=+X, −X, +Y, −Y, +Z, −Z) and three triangulation baselines $\Delta S_X = \Delta S_Y = \Delta S_Z$. The $C_{T,I}$ measurement points and $\Delta S_i$ baselines are symmetrically disposed on the axes of an XYZ coordinate system whose origin (O) is located at the center of cubic symmetry. Specific coordinates of the $C_T$-parameter measurement points are:

$C_{T,+X} = (0.5\Delta S_X, 0, 0)$;

$C_{T,-X} = (-0.5\Delta S_X, 0, 0)$;

$C_{T,+Y} = (0, 0.5\Delta S_Y, 0)$;

$C_{T,-Y} = (0, -0.5\Delta S_Y, 0)$;

$C_{T,+Z} = (0, 0, 0.5\Delta S_Z)$; and $C_{T,-Z} = (0, 0, -0.5\Delta S_Z)$.

Figure 4:
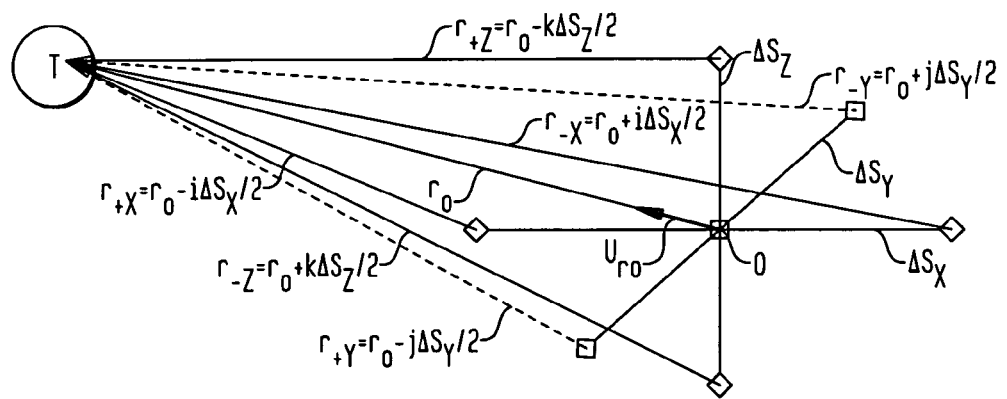
FIG. 4 illustrates geometrical relationships between a magnetic target (T), $C_{T,I}$ point-to-target vectors ($r_i$), and the sensor-array-to-target vector ($r_o$)

Referring additionally to FIG. 4, geometrical relationships are illustrated between a magnetic target (T) and the quantities $C_{T,I}$, $\Delta S_i$, $r_I$, $r_o$, and $U_{ro}$ that the present invention's methods use for DLC of the target. In the invention's adaptation of the central potential type function $C_{T,I} = (\mu/4\pi)kMr_1^{-4}$ (where $\mu$ is the magnetic permeability constant of the media surrounding the target and is $\approx 4\pi \times 10^{-7}$ (Tesla)×(meter/ampere) for nonmagnetic media) and $\pi$ is the constant 3.14), the $r_I$ term corresponds to the magnitude of the position vector of target T with respect to each $C_{T,I}$ measurement point (I) where I=+X, −X, +Y, −Y, +Z, −Z. Thus, for example, $C_{T,+Z} = (\mu/4\pi)kM(r_{+Z})^{-4}$. The central $r_o$ vector is the target position vector measured with respect to the center of symmetry O of the STAR sensor array that is also the origin of the XYZ/i,j,k coordinate system. The geometry of the invention's sensor array facilitates transformation between the $r_o$ vector and the $r_I$ vectors and, thereby, facilitates the invention's improved DLC methods.

Figure 5:
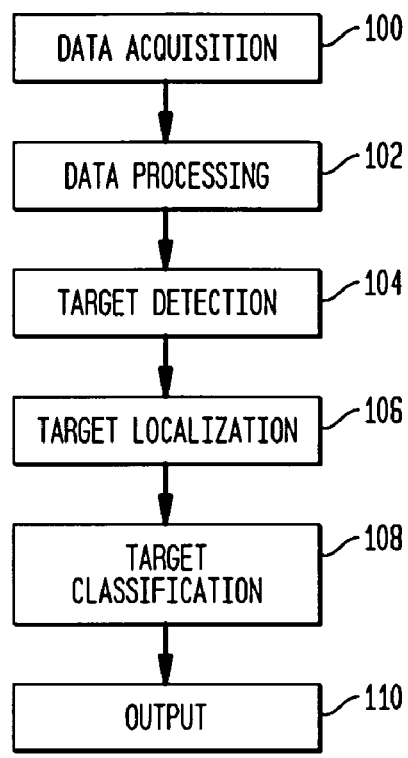
FIG. 5 is a simplified flowchart of the general magnetic sensing process in accordance with the present invention.

Referring additionally now to the flowchart illustrated in FIG. 5, the general operation of system 10 for DLC of magnetic objects will be described. Note that specific details, e.g., number and spacing of $C_T$ parameters, development and use of higher order gradients, etc., will depend on the specific sensor system embodiment and its application. The simplified flowchart illustrated in FIG. 5 presents six basic steps in the present invention. The first three steps (i.e., Data Acquisition step 100, Data Processing step 102, and Target Detection step 104) have been previously disclosed in one or more of the above-noted patents and will, therefore, only be discussed briefly here. Target Localization step 106 applies the novel approaches of the present invention for an improved determination of the target position vector. Target Classification step 108 uses the target position components determined in step 106 to determine the magnetic moment vector of the target that serves as the means to classify/discriminate the magnetic target. Finally, Output step 110 outputs the magnetic target's position vector and magnetic moment vector to one or more output devices (e.g., a visual display, an audio output, etc.) and/or another application for further processing in which case the DLC-related data can be in a computer-discernable format.

More specifically, operation of the present invention involves the following steps:

At step 100, processor 30 reads and stores B-field data from each TM sensor of the sensor array. The B-field data is processed to generate motion compensated components of B-field data as described in, for example, the '610 patent. Differences are calculated in respective B-field components between the TM sensors that comprise a given independent gradiometer-subset (I) of the array. If necessary, field and gradient imbalance correction factors are applied as described in, for example, the '610 patent, as a means of sensor orientation compensation.

At step 102, the total, nine-component tensors $G_I$ are calculated for the respective gradiometer subsets of the STAR sensor. As is known in the art of STAR processing, imbalance compensation can be applied to the tensor components if necessary. Next, the three-dimensional array of $C_{T,I}$ parameters (relevant to the sensor embodiment that is being used) are calculated.

At step 104, the sum of $C_{T,I}$ parameters ($\Sigma C_{T,I}$) is compared with a gradient contraction threshold value. (Typically, in order to avoid false indications of target detection, the threshold value is selected to be well above (i.e., approximately greater than 3 dB) the sensor's electronic noise level. If the selected gradient contraction threshold is not exceeded, it is assumed there is no target and steps 100 and 102 are repeated. If the gradient contraction threshold is exceeded, a target-of-interest is assumed to have been detected and the $C_{T,I}$ parameters are passed to step 106 for processing in accordance with the methods of the present invention.

Target Localization step 106 involves the application of one or both of the present invention's two novel approaches for determining the target position vector $r_o$ from the target to the center of the cubic space defined by the TM sensor array. The first of these approaches, referred to herein as the "directional derivative" (DD) method, is particularly useful when the magnetic target resides in a crowded field of magnetic anomalies. The second of these approaches, referred to herein as the "least squares fit" (LSF) method, is useful when the magnetic target is isolated in a fairly constant background field such as the Earth's magnetic field. The two approaches can be performed in parallel (e.g., simultaneously if processor 30 is a parallel processor) with the results of the two approaches then being correlated to provide a robust target localization methodology. Both the DD method and the LSF method have the advantage that they do not require a particular axis of a sensor array to be pointed toward the target.

Figure 6:
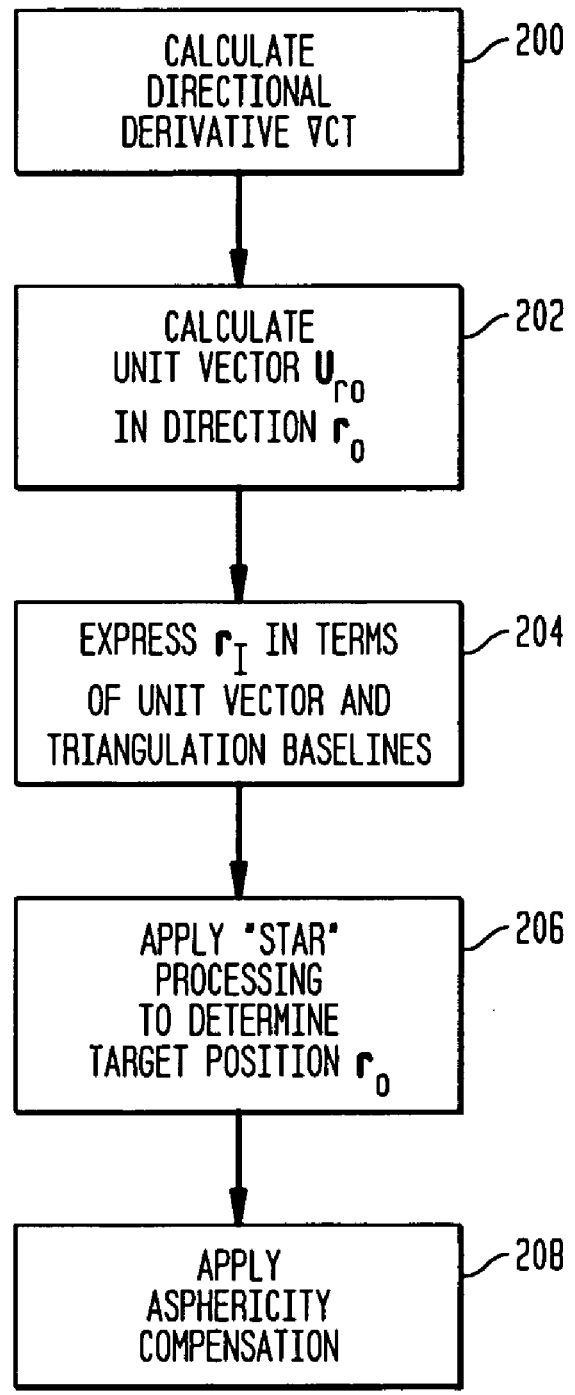
FIG. 6 is a simplified flowchart of the directional derivative target localization method in accordance with the present invention.

The DD method will be explained with the aid of the flowchart illustrated in FIG. 6 that outlines the basic steps of this novel process. The DD method uses the gradient contraction $C_{T,I}$ parameters developed in step 104. Note that for a dipole field, $C_{T,I} = (\mu/4\pi)kMr_I^{-4}$ where $r_I$ is the vector from the $C_{T,I}$ measurement point to the target. Thus, $C_T$ has the form of a central potential type field and the gradient of $C_T$ is a vector that points toward the source of the potential field; namely, the magnetic object or target. Accordingly, the first step 200 of the DD method involves calculation of the spatial gradient of $C_T$ ($\nabla C_T$). The magnitude of $\nabla C_T$ is the value of the directional derivative of the function $C_T = (\mu/4\pi)kMr_I^{-4}$ in the direction of the greatest rate of change of $C_T$; that is, in the direction $r_o$ toward the target. Thus, step 200 calculates $\nabla C_T \approx i(\Delta C_{T,X}/\Delta S_X) + j(\Delta C_{T,Y}/\Delta S_Y) + k(\Delta C_{T,Z}/\Delta S_Z)$ where i,j,k are unit vectors along the sensor's XYZ axes and $\Delta C_{T,X} =$ ($C_{T,+X}-C_{T,-X}$), etc. Note that $\nabla C_T$ is along the $r_o$ vector and is measured with respect to the center of symmetry O of the TM sensor array. Also, note that $\nabla C_T \propto r^{-5}$ whereas $C_T \propto r^{-4}$. Therefore $\nabla C_T$ decreases more rapidly with sensor-target distance r than $C_T$ does. However, as discussed below, the use of both $C_T$- and $\nabla C_T$-derived quantities provides the invention with unique and valuable capabilities for discrimination of magnetic targets in magnetically cluttered environments.

Next, at step 202, the unit vector ($U_{ro}$) along the $r_o$ vector to the target is calculated. That is, step 202 calculates $U_{ro}=\nabla C_T/|\nabla C_T|$. Thus, in terms of $U_{ro}$, $r_o=r_o U_{ro}$ and the XYZ components of $r_o$ are $r_{oX}=r_o U_{ro} \cdot i$, $r_{oY}=r_o U_{ro} \cdot j$, $r_{oZ}=r_o U_{ro} \cdot k$ where the "bold dot" represents a scalar multiplication operation between two vectors. Step 204 expresses magnitudes of $r_I$ vectors in terms of their respective triangulation baselines $\Delta S_i$, $r_o$, unit vector $U_{ro}$ and XYZ unit vector (i.e., i,j,k). More specifically, this step involves calculations of scalar projections (i.e., distances) of triangulation baselines in the direction of the $r_o$ vector to the target. That is, step 204 calculates $U_{ro} \cdot i \Delta S_X$, $U_{ro} \cdot j \Delta S_Y$, and $U_{ro} \cdot k \Delta S_Z$. For example and with reference to FIG. 4, $|r_{+X}|=|r_o-i\Delta S_X/2|$, etc. That is, for the scalar projection distance $r_{+X}$, a) $r_{+X} = [r_o - i\Delta S_X/2) \cdot (r_o - i\Delta S_X/2)]^{0.5}$ b) $= [r_o^2 - r_o \cdot i\Delta S_X + (\Delta S_X/2)^2]^{0.5}$ c) $= r_o[1 - U_{ro} \cdot i\Delta S_X/r_o + (\Delta S_X/2r_o)^2]^{0.5}$ Note that c) can be solved directly for $r_o$; however, it is useful to apply the approximation indicated in d) (below) to linearize/simplify the equation.

$\approx r_o - U_{ro} \cdot i\Delta S_X/2$ (for $r_o \approx >3\Delta S_X$)    d)

Similarly, $r_{-X}=r_o[1+U_{ro} \cdot i\Delta S_X/r_o+(\Delta S_X/2r_o)^2]^{0.5}$ $r_{-X} \approx r_o + U_{ro} \cdot i\Delta S_X/2 = r_{+X} + U_{ro} \cdot i\Delta S_X$ Similar relations in terms of $r_o$, $U_{ro}$ and the respective baselines $\Delta S_i$ can be obtained for the magnitudes of the remaining projection distances $r_{+Y}$, $r_{-Y}$, $r_{+Z}$ and $r_{-Z}$.

Next, at step 206, the STAR process described in the above-noted patents is applied using the gradient contraction $C_{T,I}$ parameters and the relations between $r_I$ (and/or ro) magnitudes and the respective scalar projections determined in step 204. For example, $r_{+X}/r_{-X}=r_{+X}/(r_{+X}+U_{ro} \cdot i\Delta S_X)=(C_{T,-X}/C_{T,+X})^{0.25}$ $r_{+X}=(U_{ro} \cdot i\Delta S_X)[(C_{T,+X}/C_{T,-X})^{0.25}-1]^{-1}$ $r_o=(U_{ro} \cdot i\Delta S_X)[(C_{T,+X}/C_{T,-X})^{0.25}-1]^{-1}+0.5 U_{ro} \cdot i\Delta S_X$ Thus, $r_o=r_o U_{ro}=\{U_{ro} \cdot i\Delta S_X)[(C_{T,+X}/C_{T,-X})^{0.25}-1]^{-1}+0.5 U_{ro} \cdot i\Delta S_X\} U_{ro}$ As indicated above, this step could use any two of the corresponding pairs of $C_T$-parameters (i.e., either ($C_{T,+X}$, $C_{T,-X}$) or ($C_{T,+Y}$, $C_{T,-Y}$) or ($C_{T,+Z}-C_{T,-Z}$)) to determine $r_o$. However, for best accuracy, this step preferably uses the relations between $U_{ro}$ and all of the $C_{T,I}$, $r_I$, and $\Delta S_i$ to determine the best average value for target position vector $r_o$. Specifically, the XYZ components of $r_o$ are calculated where $r_{oX}=i \cdot r_o U_{ro}$, $r_{oY}=j \cdot r_o U_{ro}$, and $r_{oZ}=k \cdot r_o U_{ro}$. Upon determination of $r_o$ and/or an $r_i$ value, a value for $M'=(\mu/4\pi)kM=C_{T,I}r_I^4$ can also be obtained in this step. Since the value of k is between 4.2 and 7.3, M' determines the range of self-consistently acceptable values for magnetic signature M, i.e., $(4\pi/7.3\mu)M' \leq M \leq (4\pi/4.2\mu)M'$.

As described in the '994 patent, by using the ro components in the gradient tensor equations, the XYZ components of the target signature vector M can be calculated in Target Classification step 108 (FIG. 5). In step 108, the value obtained for |M| should be consistent with the range of M-values that was determined in step 206. If desired, the Asphericity Compensation scheme disclosed in the '399 patent can be applied in step 208 to enhance DLC accuracy by removing errors in $r_o$ and M values due to the asphericity of the $C_T$ potential field. The resulting target parameters (e.g., $r_o$ and M values) can be output at step 110 to (i) a user display and/or audio device, and/or (ii) another application. Note that for some applications the $r_o$ values could also be conveniently expressed in spherical coordinates (e.g., in $r\theta\phi$ coordinates located at the center of cubic symmetry O) in terms of the target's scalar range $r_o$, its elevation angle $\theta$, and its bearing angle $\phi$, relative to the sensor system.

Since the DD method determines target direction by taking the derivative of the $C_T$ function, it can use the $\nabla C_T$ function to narrow the sensor's field-of-view and thereby "sharpen" the sensor's target-discrimination capability. The invention's innovative use of both $C_T$- and $\nabla C_T$-derived quantities allows development of a unique capability for discrimination of magnetic objects in magnetically cluttered environments. Thus, the DD method constitutes an important modality for localization and discrimination of targets in magnetically complex environments. In particular, even in the presence of magnetic clutter and/or non-dipolar sources, the directional derivative vector will point in the direction of the strongest field-gradients, i.e., toward the nearest and/or locally strongest magnetic anomaly/target.

Figure 7:
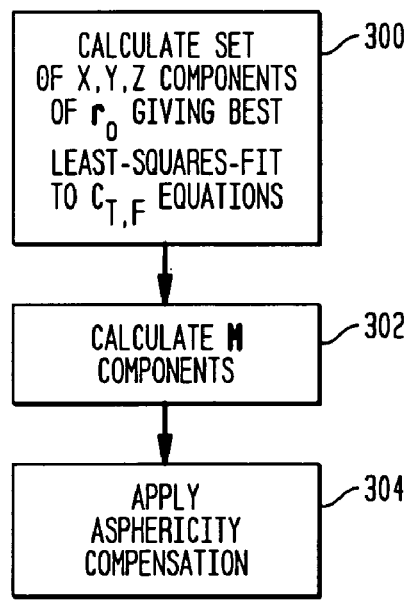
FIG. 7 is a simplified flowchart of the least squares fit target localization method in accordance with the present invention.

When there is only a single, magnetic dipole type target in the TM sensor array's field-of-view, the present invention's LSF method may provide target localization results that are less susceptible to sensor system noise. The LSF method will now be explained with the aid of the flowchart illustrated in FIG. 7. The LSF method also uses the gradient contraction $C_{T,I}$ parameters developed in step 106 (FIG. 5) to self-consistently determine the set of XYZ components of $r_o$ (i.e., $r_{oX}$, $r_{oY}$, $r_{oZ}$) that provide the best fit (in a least-squares sense) to at least three of the $C_{T,I}=(\mu/4\pi)kMr_I^{-4}$ set of six equations for the parameters $C_{T,+X}$, $C_{T,-X}$, $C_{T,+Y}$, $C_{T,-Y}$, $C_{T,+Z}$, $C_{T,-Z}$. For example, in terms of $r_o$ (vector from center of array to target), unit vector i, and triangulation baseline $\Delta S_X$, the equation for $C_{T,+X}$ can be expressed as follows:

$C_{T,+X} = (\mu/4\pi)kM[|(r_o - i\Delta S_X/2)|]^{-4}$ $= M'[r_o^2 - r_o \cdot i\Delta S_X + (\Delta S_X/2)^2]^{-2}$ $= M'[r_o^2 - r_{oX}\Delta S_X + (\Delta S_X/2)^2]^{-2}$ where $r_o=[(r_{oX})^2+(r_{oY})^2+(r_{oZ})^2]^{0.5}$ and $M'=(\mu/4\pi)kM$.

Specifically, at step 300 the LSF method performs the following operations:

1) Selects a set of initial values for $r_{oX}$, $r_{oY}$, $r_{oZ}$ in accordance with the "STAR constraint" discussed below.

2) Uses the $r_{oX}$, $r_{oY}$, $r_{oZ}$ values in the $C_{T,I}$ equations to calculate a set of $C_{T,I}$ parameters and their ratios.

3) Calculates the sum of squares of the differences between the calculated $C_{T,I}$ values and the $C_{T,I}$ values that were measured by the sensor array.

4) Determines if the sum of squares is greater than a predetermined "tolerance parameter". If the sum of the squares is greater, the process goes to operation 5 described below. If the sum of the squares is less than or equal to the tolerance parameter, the process goes to operation 6 described below.

5) Applies a set of differential "adjustments" ($\Delta r_{oX}$, $\Delta r_{oY}$, $\Delta r_{oZ}$) to the $r_{oX}$, $r_{oY}$, $r_{oZ}$ values and returns to operation 2. The differential "adjustments" $\Delta r_{oX}$, $\Delta r_{oY}$, $\Delta r_{oZ}$ can be determined by using a procedure such as Newton's root-finding method (or equivalent) in combination with the "STAR constraint" described below.

6) Uses the LSF-determined $r_{oX}$, $r_{oY}$, $r_{oZ}$ values to calculate $M'=C_{T,I}r_I^4$.

With regard to the "STAR constraint" mentioned in operations 1 and 5 above, note that the $C_{T,I}$ equations referred to in operation 2 are polynomial equations of the fourth degree in the unknown quantity $r_o$ and its components ($ir_{oX}$, $jr_{oY}$, $kr_{oZ}$). The existence of multiple roots for such an equation can lead to problems of "uniqueness" wherein multiple LSF-derived solutions may exist for a given set of $C_{T,I}$ parameters. In order to ensure rapid convergence of the LSF process to the one true position of the target, the following approach is used. For each set of $C_T$ parameters, the processes of first selecting (operation 1) and then iteratively adjusting (operation 5) $r_{oX}$, $r_{oY}$, $r_{oZ}$ preferably should be performed subject to a unique STAR-based constraint. The STAR constraint requires the components $ir_{oX}$, $jr_{oY}$, $kr_{oZ}$, respectively, to be numerically proportional to, and have the same sign as, the components of $\nabla C_T \approx i(\Delta C_{T,X}/\Delta S_X)+j(\Delta C_{T,Y}/\Delta S_Y)+k(\Delta C_{T,Z}/\Delta S_Z)$. Then, the resultant LSF solution for $r_o$ will be forced to be parallel to, and have the same sense as, $\nabla C_T$ and thereby uniquely correspond to the true position of the magnetic target. Note that upon determination of $r_o$ and/or an $r_I$ value, a value for $M'=(\mu/4\pi)kM=C_{T,I}r_I^{-4}$ can also be obtained in this step. Since the value of k is between 4.2 and 7.3, M' determines the range of self-consistently acceptable values for M, i.e., $(4\pi/7.3\mu)M' \leq M \leq (4\pi/4.2\mu)M'$.

Next, as described in the '994 patent, step 302 calculates the XYZ components of target signature vector M using the $r_o$ components developed in step 300 in the gradient tensor equations. In step 302, the value obtained for |M| should be consistent with the range of M-values that was determined in step 300. If desired, asphericity compensation can be applied at step 304 to the $r_o$ and M values to enhance their accuracy. The resulting target parameters (e.g., $r_o$ and M values) can be output at step 110 (FIG. 5) to one or more of a display device, an audio device, and another application. Again, note that for some applications, the $r_o$ values could also be conveniently expressed in spherical coordinates (e.g., in $r\theta\phi$ coordinates located at the center of cubic symmetry O) in terms of the target's scalar range $r_o$, its elevation angle $\theta$, and its bearing angle $\phi$, relative to the sensor system.

The $r_o$ and H values independently determined by the DD and LSF methods can also be correlated to one another as part of steps 106 and 108. Since it will generally not be known if a target is isolated or residing in a crowded field of magnetic anomalies, it may be preferred to correlate the results from the LSF and DD methods with each other and with the measurements of individual tensor components of the $G_I$ to provide more accurate real-time DLC and a modality for improved characterization of magnetic anomaly fields.

Figure 8:
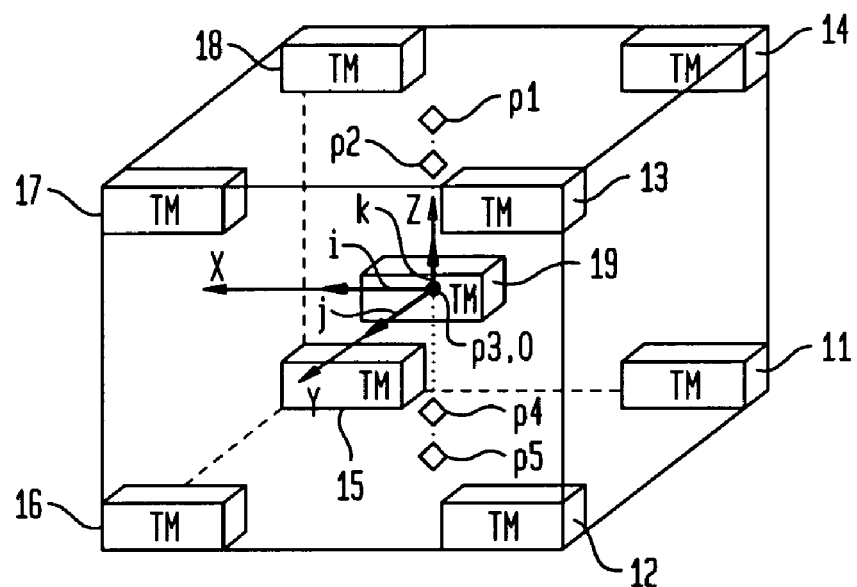
FIG. 8 is a 9-TM sensor "body-centered cubic" (BCC) sensor array in accordance with another embodiment of the present invention.

The present invention is not limited to the simple cubic array of TM sensors illustrated in FIG. 2. That is, it is to be understood that the present invention can utilize TM sensor arrays that add TM sensors to the above-described simple cubic array to provide improved discrimination of magnetic objects in cluttered environments. For example, FIG. 8 illustrates a "body centered cubic" (BCC) array of nine TM sensors 11-19 where TM sensor 19 is positioned at the center of the cubic space defined by TM sensors 11-18.

The BCC embodiment develops and uses data sets that are symmetrically disposed along the system's XYZ coordinate axes. In effect, the symmetry of the BCC array allows development of two complete intercalated STAR gradiometers. By comparing the STAR gradiometers' respective data sets, the invention can perform more effective DLC of isolated targets, more effective determination of the nature (i.e., dipolar or non dipolar) of the magnetic anomaly field in magnetically cluttered environments, adaptive enhancement (sharpening) of target discrimination in magnetically cluttered environments, and reduction of sensor aperture effects that can occur as a sensor system approaches very near to a magnetic object.

In general, TM sensor 19 at the geometric center (O) of the sensor system measures a set of $B_X$, $B_Y$, $B_Z$ data that the system processor uses to develop field gradients between O and the six cube faces. Each set of five TM sensors comprised by TM sensor 19 and the four TM sensors of a cube face comprise a three-dimensional, pyramidal magnetometer/gradiometer whose data are used by the system processor to develop a set of tensor components $G_{ij}$ and a $C_T$ parameter such that each corresponds to a point that is near the geometric center of the pyramid and located on an XYZ coordinate axis of the sensor system.

For clarity of illustration, the system's XYZ/i,j,k coordinate system is shown away from its true position at the geometric center O of the array. By way of example, the following calculations relate to sets of data along the system's Z-axis. Similar calculations will apply to respective data sets along the X and Y axes.

TM sensors 13, 14, 17 and 18 (comprising an upper (+Z) planar gradiometer) measure XYZ components of B-field at their respective positions.

The processor calculates the average values of: a) Bx, By, Bz; and b) the components $G_{ij}$ of the magnetic gradient tensor $G_{p1}$ at point p1 (the center of the upper planar gradiometer).

The processor then calculates the gradient contraction parameter $C_{T,p1}=[\Sigma(G_{ij})^2]^{0.5}=k(\mu/4\pi)M(r_{p1})^{-4}$ at p1.

TM sensors 13, 14, 17, 18 and 19 (comprising an upper pyramidal gradiometer) measure XYZ components of B field at their respective positions.

The processor calculates the average values of: a) Bx, By, Bz; and b) the components $G_{ij}$ of the magnetic gradient tensor $G_{p2}$ at point p2 (located on the Z-axis a distance below the center of the upper planar gradiometer).

The processor calculates a gradient contraction parameter $C_{T,p2}=[\Sigma(G_{ij})^2]^{0.5}=k(\mu/4\pi)M(r_{p2})^{-4}$ at p2.

TM sensors 11, 12, 15, 16 and 19 (comprising a lower pyramidal gradiometer) measure XYZ components of B field at their respective positions.

The processor calculates the average values of: a) Bx, By, Bz; and b) the components $G_{ij}$ of the magnetic gradient tensor $G_{p4}$ at point p4.

The processor calculates a gradient contraction parameter $C_{T,p4}=[(G_{ij})^2]^{0.5}=k(\mu/4\pi)M(r_{p2})^{-4}$ at p4.

TM sensors 11, 12, 15 and 16 (comprising a lower (−Z) planar gradiometer) measure XYZ components of B field at their respective positions.

The processor calculates the average values of: a) Bx, By, Bz; and b) the components $G_{ij}$ of the magnetic gradient tensor $G_{p5}$ at point p5 (the center of the lower planar gradiometer).

The processor calculates the gradient contraction parameter $C_{T,p5}=[\Sigma(G_{ij})^2]^{0.5}=k(\mu/4\pi)M(r_{p5})^{-4}$ at p5.

Thus, along the Z-axis the following quantities are developed:
- XYZ components of B-field at points p1, p3 and p5. These components can be used to calculate first and second order gradients.
- Complete gradient tensors $G_I$ at points I=p1, p2, p4 and p5.
- Gradient contractions $C_{T,I}$ at points I=p1, p2, p4 and p5.

The above quantities can be used in combination with their respective counterparts along the X and Y axes to calculate higher-order, i.e., third-rank and fourth-rank tensors that can be used to
- Sharpen the discrimination between targets in magnetically cluttered environments;
- Determine validity of the dipole approximation; and
- Provide a higher amplitude $\Sigma C_{T,I}$ data set for more robust target detection.

Figure 9:
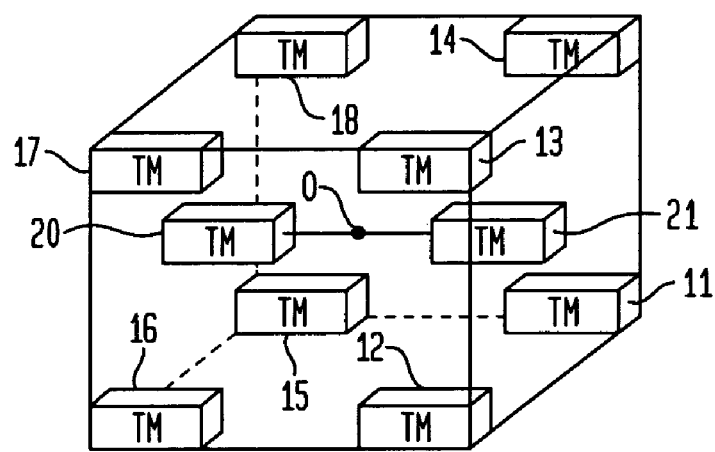
FIG. 9 is a 10-TM sensor "opposing-face-centered cubic" sensor array in accordance with another embodiment of the present invention.
Figure 10:
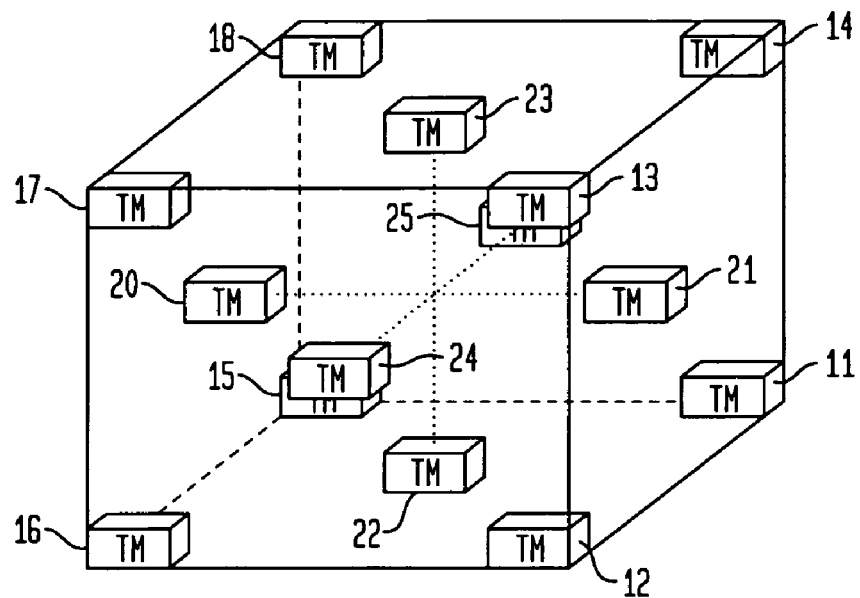
FIG. 10 is a 14-TM "face-centered cubic" (FCC) sensor array in accordance with another embodiment of the present invention.
Figure 11:
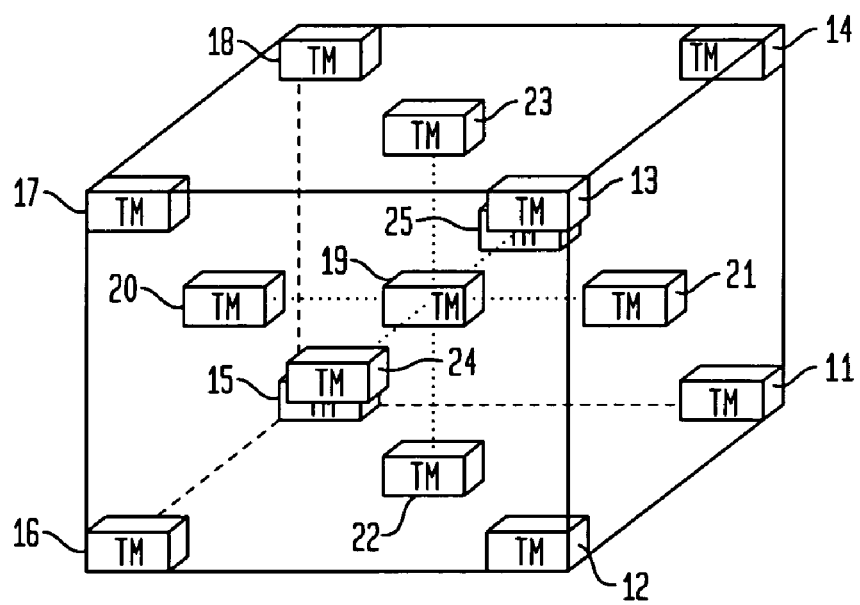
FIG. 11 is a 15-TM sensor array that is a combination of the BCC and FCC sensor arrangements in accordance with another embodiment of the present invention.

Still other embodiments of TM sensor arrays of the present invention are illustrated in FIGS. 9-11. FIG. 9 is a 10-TM sensor "opposing face centered cubic" array that starts with the simple cubic array (FIG. 2) and adds TM sensors 20 and 21 at the centers of two opposing faces of the simple cubic array. This embodiment has functions and capabilities similar to those of the BCC array. FIG. 10 illustrates a 14-TM sensor "face centered cubic" (FCC) array that starts with the simple cubic array and adds a TM sensor (i.e., one of TM sensors 20-25) to the center of each face of the cubic array. FIG. 11 illustrates a 15-TM sensor array that is a combination of the BCC and FCC arrays. Although construction of the embodiments of FIGS. 10 and 11 involves more complexity and cost than the simple cubic array of FIG. 2, they generate data sets that are much more powerful. For example, the data from the embodiment of FIG. 11 can be combined to form multiple intercalated STAR gradiometers that comprise, in effect, an array of symmetrically disposed STAR gradiometers. The vector, tensor and scalar data from the resulting "array of gradiometer arrays" can provide a unique capability for DLC of magnetic targets in regions characterized by severe magnetic clutter.

The advantages of the present invention are numerous. The invention can operate with no constraints on sensor platform motion and it has no requirements/preferences for a particular orientation of the sensor system with respect to the target. The improved sensor system embodiments provide more complete data sets for application of novel and more effective signal processing approaches to DLC of magnetic anomaly fields. The present invention's combination of unique sensor system designs and signal processing methods reduce the extremely complex vector and tensor field problem to an inherently simpler scalar-potential-type problem. The sensor embodiments and processing methods provide a basis for the following advantages:
- Improved capability for discrimination of individual magnetic targets in magnetically complex environments characterized by multiple, overlapping magnetic anomaly fields.
- Improved capability for discrimination between dipolar and non-dipolar magnetic anomaly fields.
- Reduction of sensor aperture effects when a sensor system approaches very near to a magnetic target.

As a result of these advantages, the present invention can be used a wide variety of commercial and military applications where its improved magnetic detection and ranging capabilities will have an advantage over other prior art magnetic localization and discrimination systems. In general, the present invention can be used in stationary or mobile magnetic DLC applications. For example, some important applications include the following:

- Detection, localization and classification of magnetic objects such as Unexploded Ordnance (UXO) and buried mines.
- Identification and tracking of vessels entering a harbor.
- Localization and tracking of motor vehicles for traffic control (including control of traffic lights).
- Autonomous, signature-based targeting of moving magnetic objects, e.g., aiming a camera at speeding motor vehicles or firing a weapon at a selected target.
- Various defense and homeland security applications including passive monitoring of border crossings.

Although the invention has been described relative to a specific embodiment thereof, there are numerous variations and modifications that will be readily apparent to those skilled in the art in light of the above teachings. For example, instead of a simple cubic structure, the magnetic sensing system could be a rectangular parallelepiped in which case $\Delta S_X \neq \Delta S_Y \neq S_Z$. It is therefore to be understood that, within the scope of the appended claims, the invention may be practiced other than as specifically described.

What is claimed as new and desired to be secured by Letters Patent of the United States is:

1. A magnetic anomaly sensing system, comprising:
   at least eight triaxial magnetometer (TM) sensors with one of said TM sensors positioned at each vertex of a cubic space, each of said TM sensors having X, Y, Z magnetic sensing axes, said TM sensors positioned such that respective ones of said X, Y, Z magnetic sensing axes are mutually parallel to one another, each of said TM sensors measuring a local magnetic field associated with a target region and generating magnetic field data indicative thereof;
   processing means coupled to said TM sensors for
   (a) processing said magnetic field data in accordance with a magnetic scalar triangulation and ranging (STAR) processing scheme to determine a plurality of gradient contractions $C_{T,I}$ at a corresponding plurality of measurement points I to include at least at the center of each face of said cubic space wherein gradient contraction pairs ($C_{T,+X}$ and $C_{T,-X}$), ($C_{T,+Y}$ and $C_{T,-Y}$) and ($C_{T,+Z}$ and $C_{T,-Z}$) are defined for each of said X, Y, Z magnetic sensing axes along corresponding X, Y and Z baselines with each of said gradient contraction pairs being symmetrically disposed about the center of said cubic space, and wherein said gradient contractions from each of said gradient contraction pairs are separated by a corresponding baseline distance $\Delta S_X$, $\Delta S_Y$ and $\Delta S_Z$ along one of said X, Y and Z baselines,
   (b) determining a directional derivative $\nabla C_T$ using said gradient contraction pairs and said baseline distances,
   (c) calculating a unit vector using said directional derivative $\nabla C_T$,
   (d) determining a projection distance from each of said measurement points toward the target region wherein each said projection distance is a function of said unit vector and one of said baseline distances $\Delta S_X$, $\Delta S_Y$ and $\Delta S_Z$, and
   (e) processing each said projection distance in accordance with said STAR processing scheme to determine first values of (i) a position vector from the center of said cubic space to the target region, and (ii) a magnetic moment vector; and
   output generation means coupled to said processing means for generating at least one of a human-discernable output and a computer-discernable output of said first values.

2. A magnetic anomaly sensing system as in claim 1 further comprising an additional one of said TM sensors positioned at the center of said cubic space.

3. A magnetic anomaly sensing system as in claim 1 further comprising a first additional one of said TM sensors positioned at the center of one face of said cubic space and a second additional one of said TM sensors positioned at the center of another face of said cubic space that opposes said one face.

4. A magnetic anomaly sensing system as in claim 1 further comprising an additional one of said TM sensors positioned at the center of each face of said cubic space.

5. A magnetic anomaly sensing system as in claim 1 further comprising an additional one of said TM sensors positioned at the center of said cubic space and at the center of each face of said cubic space.

6. A magnetic anomaly sensing system as in claim 1 wherein said output generation means comprises at least one of a visual display and an audio generator.

7. A magnetic anomaly sensing system as in claim 1 wherein said processing means further
(i) independently processes said gradient contractions $C_{T,I}$ to determine a least squares fit to the relationship $$(\mu/4\pi)kMr_I^{-4}$$

where $\mu$ is the magnetic permeability of an environment surrounding said target region,
k is an asphericity parameter characterizing variance of said gradient contractions $C_{T,I}$ from true spherical symmetry,
M is the magnetic dipole moment of the target region, and
$r_I$ is said projection distance from an I-th one of said measurement points to said target region,
wherein least squares fit values of said projection distances $r_I$ along each of said X, Y and Z baselines are defined, and
(ii) independently processes said least squares fit values in accordance with said STAR processing scheme to determine second values of said position vector and said magnetic moment vector.

8. A magnetic anomaly sensing system as in claim 7 wherein said processing means comprises a parallel processor.

9. A magnetic anomaly sensing system as in claim 7 wherein said processing means further correlates said first values with said second values to determine correlated values of said position vector and said magnetic moment vector, wherein said output generation means generates at least one of a human-discernable output and a computer-discernable output of said correlated values.

10. A method of sensing magnetic anomalies, comprising the steps of:
providing at least eight triaxial magnetometer (TM) sensors, each of said TM sensors having X, Y, Z magnetic sensing axes;
positioning one of said TM sensors at each vertex of a cubic space such that respective ones of said X, Y, Z magnetic sensing axes are mutually parallel to one another, each of said TM sensors measuring a local magnetic field associated with a target region and generating magnetic field data indicative thereof;
processing said magnetic field data in accordance with a magnetic scalar triangulation and ranging (STAR) processing scheme to determine a plurality of gradient contractions $C_{T,I}$ at a corresponding plurality of measurement points I to include at least at the center of each face of said cubic space wherein gradient contraction pairs $(C_{T,+X}$ and $C_{T,-X})$, $(C_{T,+Y}$ and $C_{T,-Y})$ and $(C_{T,+Z}$ and $C_{T,-Z})$ are defined for each of said X, Y, Z magnetic sensing axes along corresponding X, Y and Z baselines with each of said gradient contraction pairs being symmetrically disposed about the center of said cubic space, and wherein said gradient contractions from each of said gradient contraction pairs are separated by a corresponding baseline distance $\Delta S_X$, $\Delta S_Y$ and $\Delta S_Z$ along one of said X, Y and Z baselines;
determining a directional derivative $\nabla C_T$ using said gradient contraction pairs and said baseline distances;
calculating a unit vector using said directional derivative $\nabla C_T$;
determining a projection distance from each of said measurement points toward the target region wherein each said projection distance is a function of said unit vector and one of said baseline distances $\Delta S_X$, $\Delta S_Y$ and $\Delta S_Z$;
processing each said projection distance in accordance with said STAR processing scheme to determine first values of (i) a position vector from the center of said cubic space to the target region, and (ii) a magnetic moment vector; and
generating at least one of a human-discernable output and a computer-discernable output of said first values.

11. A method according to claim 10 further comprising the step of positioning an additional one of said TM sensors at the center of said cubic space.

12. A method according to claim 10 further comprising the steps of:
positioning a first additional one of said TM sensors at the center of one face of said cubic space; and
positioning a second additional one of said TM sensors at the center of another face of said cubic space that opposes said one face.

13. A method according to claim 10 further comprising the step of positioning an additional one of said TM sensors at the center of each face of said cubic space.

14. A method according to claim 10 further comprising the step of positioning an additional one of said TM sensors at the center of said cubic space and at the center of each face of said cubic space.

15. A method according to claim 10 wherein said human discernable output comprises at least one of a visual output and an audible output.

16. A method according to claim 10 further comprising the steps of:
independently processing said gradient contractions $C_{T,I}$ to determine a least squares fit to the relationship $$(\mu/4\pi)kMr_I^{-4}$$

where $\mu$ is the magnetic permeability of an environment surrounding said target region,
k is an asphericity parameter characterizing variance of said gradient contractions $C_{T,I}$ from true spherical symmetry,
M is the magnetic dipole moment of the target region, and
$r_I$ is said projection distance from an I-th one of said measurement points to said target region, wherein least squares fit values of said projection distances $r_I$ along each of said X, Y and Z baselines are defined; and
independently processing said least squares fit values in accordance with said STAR processing scheme to determine second values of said position vector and said magnetic moment vector.

17. A method according to claim 16 further comprising the steps of:
correlating said first values with said second values to determine correlated values of said position vector and said magnetic moment vector; and
generating at least one of a human-discernable output and a computer-discernable output of said correlated values.

18. A method according to claim 16 wherein said step of independently processing said gradient contractions $C_{T,I}$ to determine said least squares fit includes the step of constraining components of said projection distance $r_I$ based on components of said directional derivative $\nabla C_T$.

* * * * *